US012283969B2

(12) United States Patent
Huang (10) Patent No.: US 12,283,969 B2
(45) Date of Patent: Apr. 22, 2025

(54) TIME-INTERLEAVED ANALOG TO DIGITAL CONVERTER BASED ON CONTROL OF COUNTER

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 209 days.

(21) Appl. No.: 18/137,079

(22) Filed: Apr. 20, 2023

(65) Prior Publication Data
US 2024/0113726 A1    Apr. 4, 2024

(30) Foreign Application Priority Data
Sep. 29, 2022 (TW) .................................. 111137117

(51) Int. Cl.
    *H03M 1/12*      (2006.01)
    *H03M 1/50*      (2006.01)

(52) U.S. Cl.
    CPC ........... *H03M 1/50* (2013.01); *H03M 1/1245* (2013.01)

(58) Field of Classification Search
    CPC .......................... H03M 1/1245; H03M 1/0668
    USPC ................................................. 341/155, 172
    See application file for complete search history.

(56) References Cited

U.S. PATENT DOCUMENTS

| | | | |
|---|---|---|---|
| 5,990,815 A | 11/1999 | Linder et al. |
| 10,763,875 B2 | 9/2020 | Huang |
| 10,778,242 B2 | 9/2020 | Huang |
| 10,790,843 B2 | 9/2020 | Huang |
| 11,239,853 B1 | 2/2022 | Dai et al. |
| 2021/0250040 A1 | 8/2021 | Jang et al. |

OTHER PUBLICATIONS

Shih-Hsiung Huang, "Time Interleaved Analog to Digital Converter", U.S. Appl. No. 17/870,983, filed Jul. 22, 2022, USPTO.
"Time-Interleaved Analog to Digital Converter Based on Flash Analog to Digital Conversion", Taiwan Patent Application No. TW 111137115 (Filing date: Sep. 29, 2022), TIPO, Taiwan.

*Primary Examiner* — Peguy Jean Pierre
(74) *Attorney, Agent, or Firm* — WPAT, PC (57) ABSTRACT

A time-interleaved analog to digital converter includes capacitor array circuits, first and second transfer circuits, a fine converter circuitry, a control circuitry, and an encoder circuit. The capacitor array circuits sample an input signal and generate first residues according to first quantization signals. The first and second transfer circuits transfer first and second residues respectively. The fine converter circuitry performs a signal conversion on the first and second residues according to a conversion control signal to generate a second quantization signal. The control circuitry generates a count signal according to the second quantization signal, and outputs the count signal as a switching signal. The capacitor array circuits generate the second residues in response to the signal conversion, and adjusts those residues according to the switching signal. The encoder circuit generates a digital output according to a corresponding first quantization signal and the second quantization signal.

20 Claims, 6 Drawing Sheets

TIME-INTERLEAVED ANALOG TO DIGITAL CONVERTER BASED ON CONTROL OF COUNTER

BACKGROUND OF THE INVENTION

1. Field of the Invention

The present disclosure relates to a time-interleaved analog to digital converter, especially to a time-interleaved analog to digital converter having noise shaping function based on control of a counter.

2. Description of Related Art

Analog to digital converter(s) is/are widely utilized in various electronic devices to convert an analog signal to a corresponding digital signal for subsequent signal processing. As the operating speed increases, the operational period for an analog to digital converters to convert signals becomes shorter and shorter. As a result, requirements (e.g., switching speed, power consumption, etc.) of some circuits (e.g., sampling circuit, comparator circuit, etc.) of analog to digital converter are getting higher, which makes it more difficult to implement analog to digital converter circuits suitable for high-speed applications.

SUMMARY OF THE INVENTION

In some aspects of the present disclosure, an object of the present disclosure is, but not limited to, provide a time-interleaved analog to digital converter based on a control of a counter, so as to make an improvement to the prior art.

In some aspects of the present disclosure, a time-interleaved analog to digital converter includes a plurality of capacitor array circuits, a plurality of first transfer circuits, a fine converter circuitry, a control circuitry, a plurality of second transfer circuits, and an encoder circuit. The plurality of capacitor array circuits are configured to sequentially sample an input signal and generate a plurality of first residue signals according to a plurality of first quantization signals, in which the plurality of first quantization signals are generated based on a coarse analog to digital conversion performed based on the input signal. The plurality of first transfer circuits are configured to sequentially transfer the plurality of first residue signals from the plurality of capacitor array circuits according to a plurality of first control signals. The fine converter circuitry is configured to perform a noise shaping signal conversion on a first signal in the plurality of first residue signals and a second signal in a plurality of second residue signals according to a conversion control signal, in order to generate a second quantization signal. The control circuitry is configured to count according to the second quantization signal to generate a count signal and the conversion control signal, and output the count signal to be a switching signal according to the plurality of first control signals. The plurality of second transfer circuits are configured to sequentially transfer the plurality of second residue signals from the plurality of capacitor array circuits to the fine converter circuitry according to a plurality of second control signals, in which the plurality of capacitor array circuit are further configured to generate the plurality of second residue signals in response to the noise shaping signal conversion and adjust the plurality of second residue signals according to the switching signal. The encoder circuit is configured to generate a digital output according to the second quantization signal and a corresponding one of the plurality of first quantization signals.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may be a single system formed with at least one circuit, and the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

In some embodiments, implementations of certain circuits may be understood with reference to related circuits in a first literature (U.S. Pat. No. 10,763,875), a second literature (U.S. Pat. No. 10,778,242) and a third literature (U.S. Pat. No. 10,790,843), but the implementations of those circuits are not limited thereto. These literatures are incorporated by reference herein in their entirety and for all purposes.

Figure 1A:
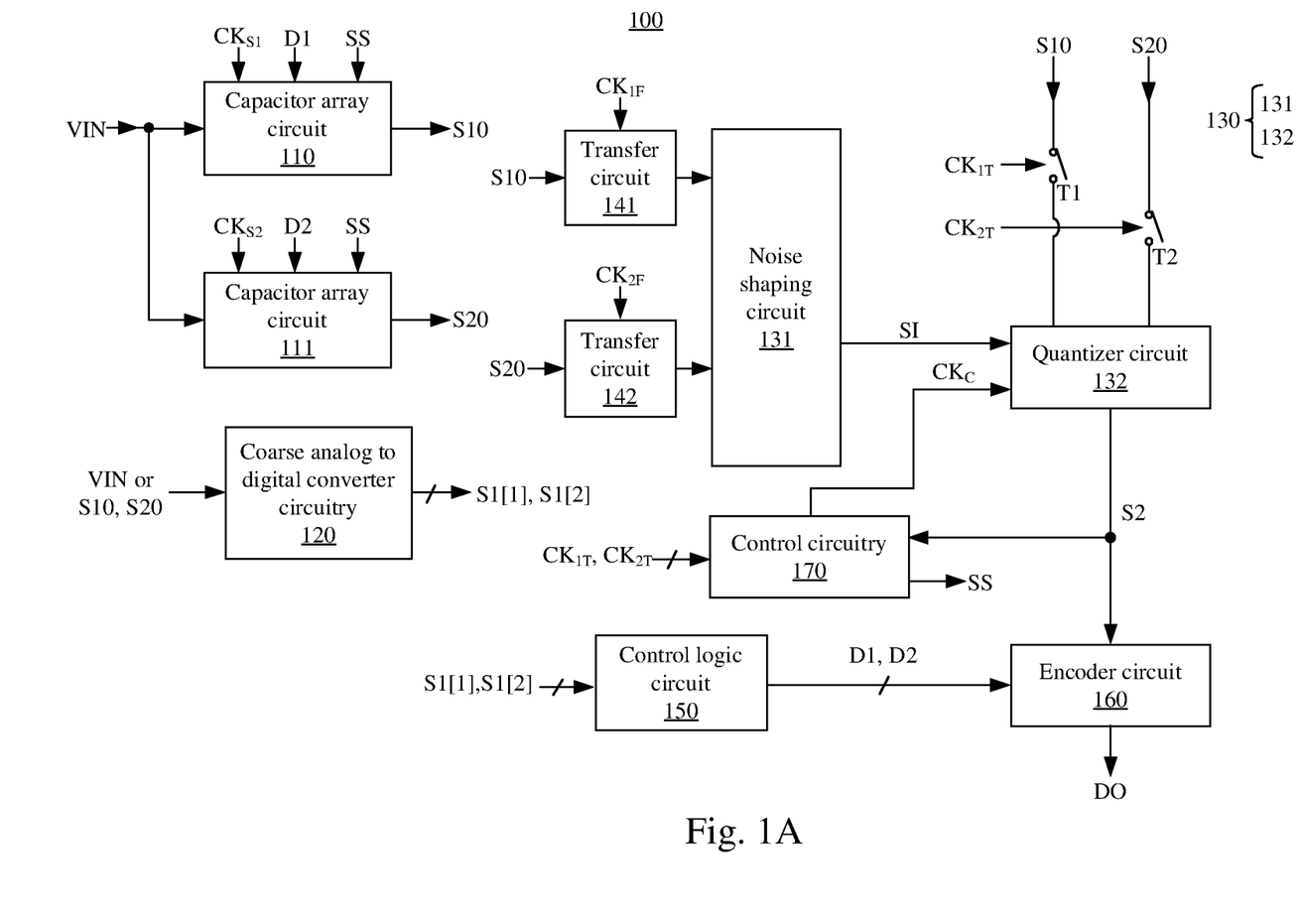
FIG. 1A illustrates a schematic diagram of a time-interleaved analog to digital converter according to some embodiments of the present disclosure.

FIG. 1A illustrates a schematic diagram of a time-interleaved analog to digital converter 100 according to some embodiments of the present disclosure. The time-interleaved analog to digital converter 100 includes capacitor array circuits 110-111, a coarse analog to digital converter circuitry 120, a fine converter circuitry 130, transfer circuits T1-T2, transfer circuits 141-142, a control logic circuit 150, an encoder circuit 160, and a control circuitry 170.

The capacitor array circuits 110-111 sequentially sample an input signal VIN according to control signals $CK_{S1}$ and $CK_{S2}$, and generate signals S10 and S20 according to quantization signals S1[1] and S1[2]. For example, the capacitor array circuit 110 samples the input signal VIN according to the control signal $CK_{S1}$, and is switched according to a digital code D1 (which is generated based on the quantization signal S1[1]) to generate the signal S10. Similarly, the capacitor array circuit 111 samples the input signal VIN according to the control signal $CK_{S2}$, and is switched according to a digital code D2 (which is generated based on the quantization signal S1[2]) to generate the signal S20.

In some embodiments, implementations of each of the capacitor array circuits 110 and 111 may be understood with reference to the capacitor C1 in the first literature or the capacitor array circuit CT1 in the second literature or the third literature, but the present disclosure is not limited to thereto. In some embodiments, each of the signals S10 and S20 may be a signal on the node N1 in the first literature, the second literature, and/or the third literature, but the present disclosure is not limited thereto. Arrangements about the capacitor array circuits 110 and 111 are described with reference to FIG. 2.

For ease of understanding, the signal S10 that is generated after the capacitor array circuit 110 is switched by the digital code D1 and the signal S20 that is generated after the capacitor array circuit 111 is switched by the digital code D2 are referred to as "first residue signals." Moreover, the signal S10 and the signal 20 that are generated by the capacitor array circuit 110 and the capacitor array circuit 111 in response to a noise shaping signal conversion performed by the fine converter circuitry 130 are referred to as "second residue signals."

The coarse analog to digital converter circuitry 120 may perform a coarse analog to digital conversion based on the input signal VIN (or the signals S10 and S20) to generate the quantization signals S1[1] and S1[2]. In different embodiments, the coarse analog to digital converter circuitry 120 may include a successive approximation register (SAR) analog to digital conversion or a flash analog to digital conversion, but the present disclosure is not limited thereto. For example, if the coarse analog to digital conversion is a SAR analog to digital conversion, the coarse analog to digital converter circuitry 120 may include quantizer circuits (not shown), which may generate the quantization signal S1[1] and S1[2] respectively according to the signal S10 and the signal S20. Under this condition, the control logic circuit 150 may perform a SAR algorithm according to a corresponding one of the quantization signals S1[1] and S1[2], in order to generate a corresponding one of the digital codes D1 and D2. Alternatively, if the coarse analog to digital conversion is the flash analog to digital conversion, the coarse analog to digital converter circuitry 120 may include quantizer circuits (not shown), which may sample the input signal VIN, and compare the sampled input signal VIN with different reference voltages respectively to generate the quantization signals S1[1] and S1[2]. Under this condition, the control logic circuit 150 may perform codec, redundant computation, and/or error correction operation(s) according to a corresponding one of the quantization signals S1[1] and S1[2], in order to generate a corresponding one of the digital codes D1 and D2. In some embodiments, the control logic circuit 150 may be implemented with one or more digital circuits that perform the corresponding operation(s).

The transfer circuits T1 and T2 sequentially transfer the signals S10 and S20 (i.e., the first residue signals) from the capacitor array circuits 110 and 111 to the fine converter circuitry 130 according to control signals $CK_{1T}$ and $CK_{2T}$. In greater detail, after a corresponding one of the quantization signals S1[1] and S1[2] is generated, each of the transfer circuits T1 and T2 transfers a corresponding signal S10 or S20 from a corresponding capacitor array circuit 110 or 111 to the fine converter circuitry 130 according to a corresponding one of the control signals $CK_{1T}$ and $CK_{2T}$. For example, after the quantization signal S1[1] is generated, the transfer circuit T1 is turned on according to the control signal $CK_{1T}$, in order to output a residue voltage of the capacitor array circuit 110 (i.e., the signal S10 at that moment) to be one of the first residue signals. With this analogy, it is able to understand a relation among the signal S20, the quantization signal S1[2], and the transfer circuit T2. In some embodiments, each of the transfer circuits T1-T2 may be implemented with switch circuits, but the present disclosure is not limited thereto.

The fine converter circuitry 130 performs the noise shaping signal conversion on a first signal of the first residue signals and a second signal of the second residue signals according to the conversion control signal $CK_C$, in order to the quantization signal S2. In greater detail, the fine converter circuitry 130 may perform the noise shaping signal conversion according to the aforementioned first and second signals during a predetermined period of the conversion control signal $CK_C$ (for example, but not limited to, a period with a low level) to generate the quantization signal S2. Alternatively, the fine converter circuitry 130 may be reset (e.g., the quantization signal S2 is reset to a predetermined level) during a reset period of the conversion control signal $CK_C$ (for example, but not limited to, a period when the conversion control signal $CK_C$ has a high level.

In some embodiments, the capacitor array circuits 110 and 111 further generate the second residue signals (e.g., the signal S10 or S20 at that moment) in response to the noise shaping signal conversion. As mentioned above, when the transfer circuit T1 transfers the signal S10 to the fine converter circuitry 130, the fine converter circuitry 130 may perform the noise shaping signal conversion. After the noise shaping signal conversion is performed, the signal S10 of the capacitor array circuit 110 (i.e., the residue voltage on the capacitor array circuit 110 at this moment) is one of the second residue signals. Alternatively, when the transfer circuit T2 transfers the signal S20 to the fine converter circuitry 130, the fine converter circuitry 130 may perform the noise shaping signal conversion. After this noise shaping signal conversion is performed, the signal S20 of the capacitor array circuit 111 (i.e., the residue voltage on the capacitor array circuit 111 at this moment) is one of the second residue signals.

The transfer circuits 141 and 142 sequentially transfer the second residue signals from the capacitor array circuits 110 and 111 to the fine converter circuitry 130 according to control signals $CK_{1F}$ and $CK_{2F}$. As mentioned above, the second residue signals are signals respectively generated from the capacitor array circuits 110 and 111 in response to the noise shaping signal conversion. In other words, after the noise shaping signal conversion is performed, the residue voltage on one of the capacitor array circuits 110 and 111 (i.e., a corresponding one the signals S10 and S20) is a corresponding one of the second residue signals. For example, after the fine converter circuitry 130 completes the noise shaping signal conversion (which is performed following to the generation of the quantization signal S1[1]), the transfer circuit 141 may be turned on according to the control signal $CK_{1F}$, in order to transfer the signal S10 from the capacitor array circuit 110 to be a corresponding one of the second residue signals. Alternatively, after the fine converter circuitry 130 completes the noise shaping signal conversion (which is performed following to the generation of the quantization signal S1[2]), the transfer circuit 142 may be turned on according to the control signal $CK_{2F}$, in order to transfer the signal S20 from the capacitor array circuit 111 to be a corresponding one of the second residue signals. In some embodiments, each of the transfer circuits 141 and 142 may be implemented with a switch circuit, but the present disclosure is not limited thereto.

The fine converter circuitry 130 may process one of the second residue signals (i.e., the second signal), and perform a quantization according to the processed result (i.e., a signal SI) and the first signal to generate the quantization signal S2. In some embodiments, the fine converter circuitry 130 includes a noise shaping circuit 131 and a quantizer circuit 132. The noise shaping circuit 131 is coupled to the transfer circuits 141 and 142 to sequentially receive the second residue signals, and processes the second signal of the second residue signals to generate the signal SI. The quantizer circuit 132 may sequentially receive the first residue signals from the transfer circuits T1-T2, and perform the quantization according to the signal SI and the first signal of the first residue signals to generate the quantization signal S2. In this embodiment, the quantizer circuit 132 may be a comparator circuit having more than two input terminals (not shown). For example, the comparator circuit may include two input pairs (which correspond to the aforementioned input terminals), in which one input pair receives the first signal, another one input pair receives the signal SI, and the comparator circuit may generate the quantization signal S2 according to a summation of the first signal and the signal SI. In some embodiments, the noise shaping circuit 131 may include an integrator circuit and a circuit portion for storing the second signal. In some embodiments, implementations of the transfer circuits 141-142 may be understood with reference to the capacitors Cex5-Cex6 in FIG. 5A of the third literature, implementations of the noise shaping circuit 131 may be understood with reference to the circuit 120 (or the circuit 122) in FIG. 5A of the third literature, and implementations of the quantizer circuit 132 may be understood with reference to the circuit 140A (or the circuit 140B) in FIG. 5A of the third literature, but the present disclosure is not limited thereto.

The encoder circuit 160 generates a digital output DO according to the quantization signal S2 and a corresponding one of the quantization signals S1[1] and S1[2]. In greater detail, when the quantization signal S2 is generated from a corresponding one of the first residue signals, the encoder circuit 160 may combine a corresponding digital code (which is generated according to the corresponding one of the quantization signals S1[1] and S1[2]) with the quantization signal S2 to be the digital output DO. For example, when the transfer circuit T1 transfers the signal S10 (i.e., the first residue signal at that moment) to the quantizer circuit 132 to generate the quantization signal S2, the encoder circuit 160 may combine the digital code D1 corresponding to the quantization signal S1[1] with the quantization signal S2 to be the digital output DO. Alternatively, when the transfer circuit T2 transfers the signal S20 (i.e., the first residue signal at that moment) to the quantizer circuit 132 to generate the quantization signal S2, the encoder circuit 160 may combine a digital code D2 corresponding to the quantization signal S1[2] with the quantization signal S2 to be the digital output DO. In some embodiments, the encoder circuit 160 may be implemented with digital logic circuit(s).

In some embodiments, the control circuitry 170 is configured to count according to the quantization signal S2 to generate a count signal (e.g., a count signal CT in FIG. 3), and output the count signal to be a switching signal SS according to the control signals $CK_{1T}$ and $CK_{2T}$. In some embodiments, the control circuitry 170 may generate a clock signal (e.g., a clock signal CLK in FIG. 3) according to the control signals $CK_{1T}$ and $CK_{2T}$, and generate the conversion control signal $CK_C$ according to this clock signal, the quantization signal S2, and a last bit of the count signal CT. In some embodiments, the capacitor array circuits 110 and 111 may further adjust the second residues signals according to the switching signal SS. Operations regarding herein will be described with reference to FIG. 3.

In practical application(s), if a wire between the quantizer circuit 132 and other circuits is too long, the load of the quantizer circuit 132 may be too high, which results in a slower processing speed of the quantizer circuit 132. Accordingly, in a layout design, the control circuitry 170 may be arranged adjacent to the quantizer circuit 132, in order to reduce the length of the wire.

Figure 1B:
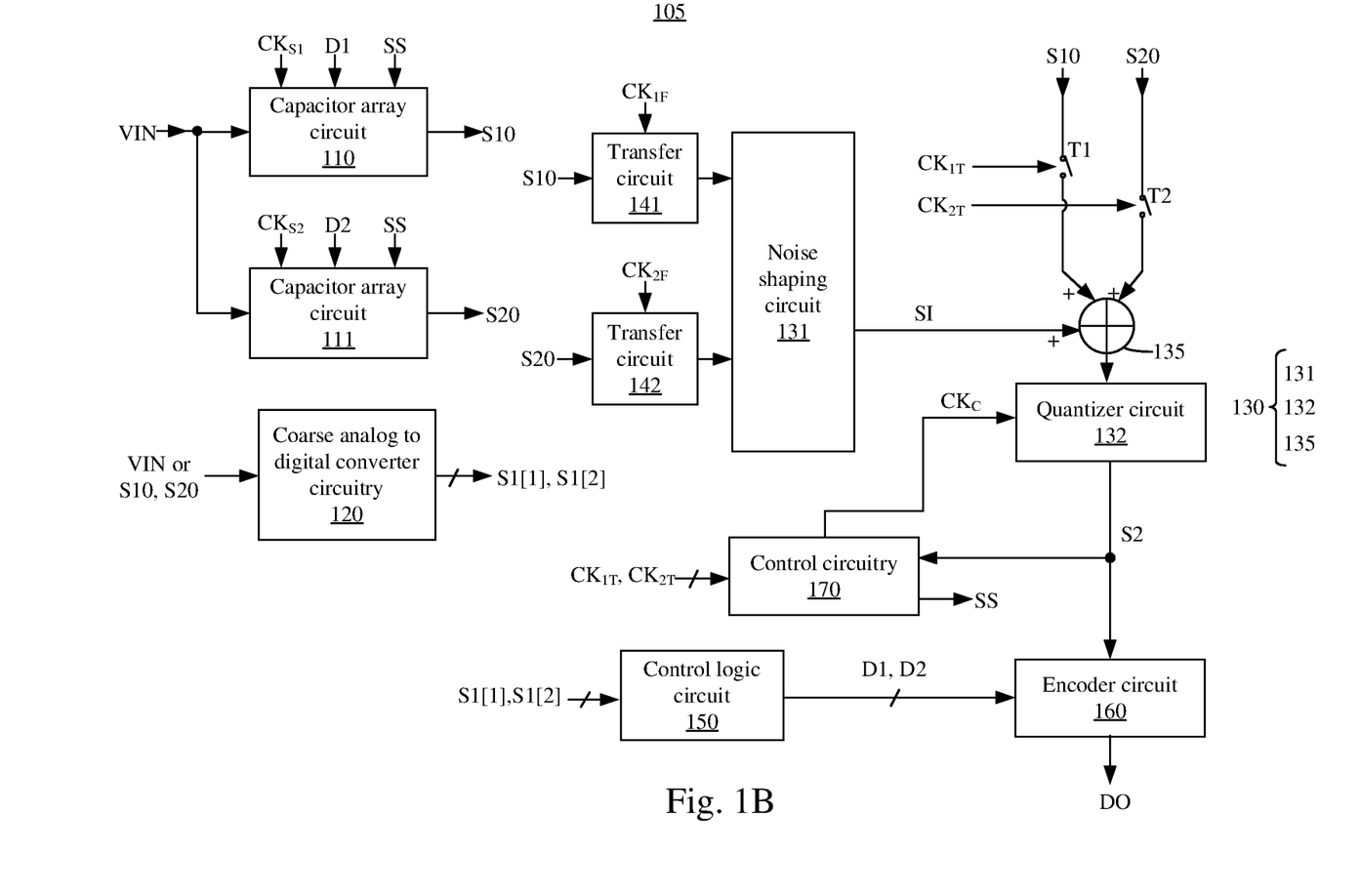
FIG. 1B illustrates a schematic diagram of time-interleaved analog to digital converter according to some embodiments of the present disclosure.

FIG. 1B illustrates a schematic diagram of time-interleaved analog to digital converter 105 according to some embodiments of the present disclosure. Compared with the time-interleaved analog to digital converter 100 in FIG. 1A, in the time-interleaved analog to digital converter 105, the fine converter circuitry 130 further includes a summing circuit 135, which may sum up the first residue signal (i.e., a corresponding one of the signals S10 and S20) and the signal SI. In this embodiment, the quantizer circuit 132 may be a comparator circuit having two input terminal, in which one input terminal receive a first input signal, another one input terminal (not shown in FIG. 1B) receives a second input signal, the first input signal and the second input signal have opposite polarities, and the amplitude of each of the first input signal and the second input signal is the summation of the first residue signal and the signal SI (i.e., the first and the second input signals are differential signals). As a result, the quantizer circuit 132 may perform the quantization according to the summation of the first residue signal and the signal SI to generate the quantization signal S2. In some embodiments, the summing circuit 135 may be implemented with a switched capacitor circuit. For example, implementations of the quantizer circuit 132 may be understood with reference to the comparator circuit 220 in the first literature, implementations of the summing circuit 135 may be understood with reference to the switching circuit 120 in the first literature, but the present disclosure is not limited thereto.

Figure 2:
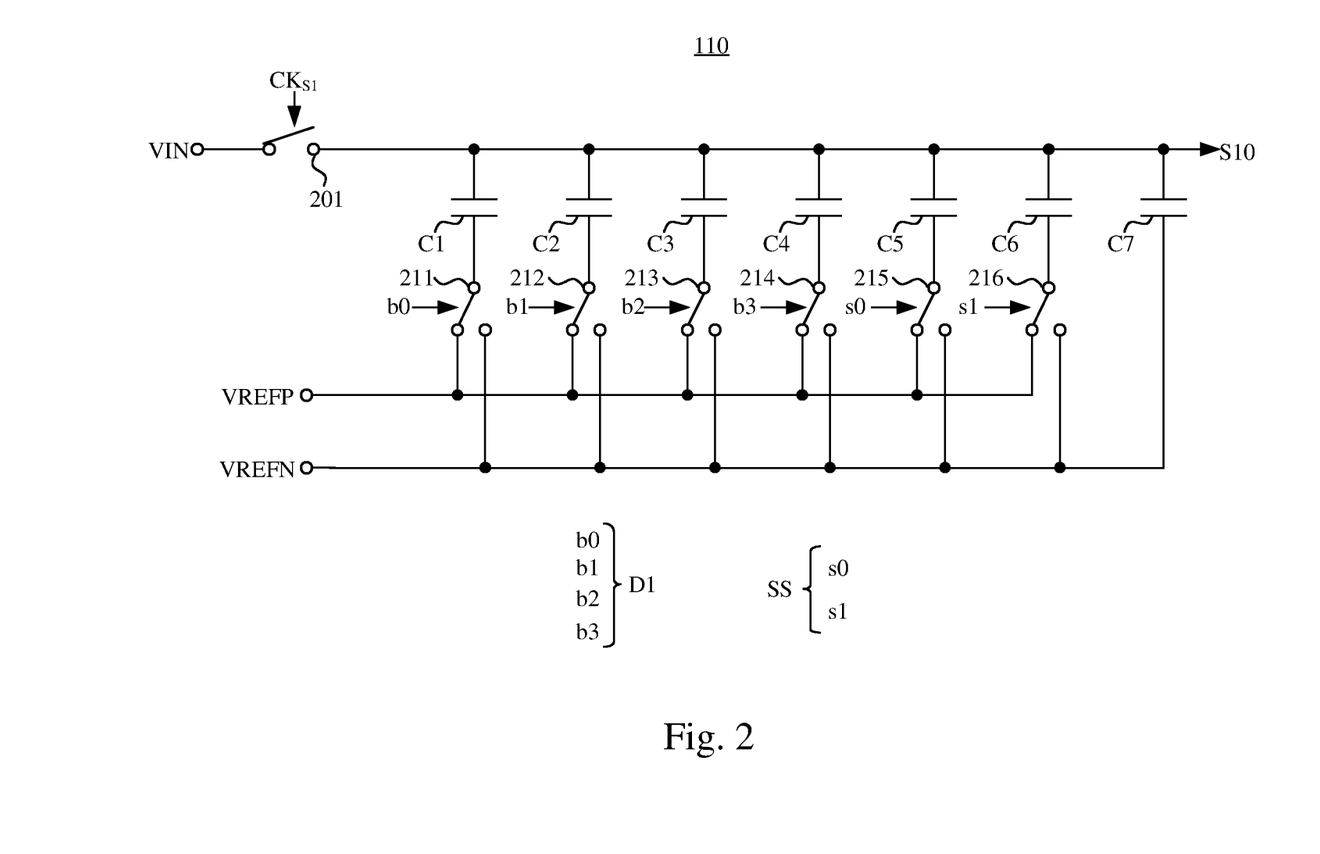
FIG. 2 illustrates a schematic diagram of the capacitor array circuit in FIG. 1A or FIG. 1B according to some embodiments of the present disclosure.

FIG. 2 illustrates a schematic diagram of the capacitor array circuit 110 in FIG. 1A or FIG. 1B according to some embodiments of the present disclosure. The capacitor array circuit 110 includes capacitors C1-C7 and switches 201 and 211-216. The switch 201 is turned on according to the control signal $CK_{S1}$, in order to transmit the input signal VIN to first terminals of the capacitors C1-C7. Under this condition, the capacitors C1-C7 may sample the input signal VIN to generate the signal S10. The switch 211-216 are respectively coupled to second terminals of the capacitors C1-C6, in order to selectively transmit a reference voltage VREFP or a reference voltage VREFN to the second terminals of the capacitors C1-C6, in which the switches 211-214 are controlled by different bits b0-b1 of the digital code D1, and the switches 215-216 are controlled by different bits s0-s1 of the switching signal SS. The second terminal of the capacitor C7 receives the reference voltage VREFN.

In greater detail, taking the switch 211 and the switch 215 as an example, a first terminal of the switch 211 is coupled to the second terminal of the capacitor C1, a second terminal of the switch 211 selectively receives the reference voltage VREFP or the reference voltage VREFN, and a control terminal of the switch 211 receives the bit b0 of the digital code D1. As a result, the switch 211 may selectively transmit the reference voltage VREFP or the reference voltage VREFN to the second terminal of the capacitor C1 according to the bit b0. Similarly, a first terminal of the switch 215 is coupled to the second terminal of the capacitor C5, a second terminal of the switch 215 selectively receives the reference voltage VREFP or the reference voltage VREFN, and the control terminal of the switch 215 receives the bit s0 of the switching signal SS. As a result, the switch 215 may selectively transmit the reference voltage VREFP or the reference voltage VREFN to the second terminal of the capacitor C5. With this analogy, it is able to understand arrangements among the remaining switches, capacitors, and the received bits, and thus the repetitious descriptions are not further given. With the above arrangements, the residue voltage on the capacitor array circuit 110 (e.g., the signal S10) may be refreshed at different times based on the quantization signal S1[1] or the quantization signal S2, in order to generate the corresponding first and second residue signals to perform the noise shaping signal conversion to improve the overall signal-to-noise ratio.

In this example, the capacitance values of the capacitors C1-C7 are set based on a binary code, in which the capacitor C7 is a dummy capacitor. For example, the capacitance value of each of the capacitors C7 and C6 may be set to be a unity capacitor value (i.e., 1C), the capacitance value of the capacitor C5 may be 2 unity capacitor values (i.e., 2C), the capacitance value of the capacitor C4 may be 4 unity capacitor values (i.e., 4C), the capacitance value of the capacitor C3 may be 8 unity capacitor values (i.e., 8C), the capacitance value of the capacitor C2 may be 16 unity capacitor values (i.e., 16C), and the capacitance value of the capacitor C1 may be 32 unity capacitor values (i.e., 32C). The capacitors C1-C4 correspond to most significant bits (which have higher weights), and the capacitors C5-C6 correspond to least significant bits (which have lower weights). In other words, in some embodiments, switches (e.g., the switches 211-214) coupled to capacitors having higher weights (e.g., the capacitors C1-C4) are controlled by the quantization signal S1[1] (which is used to generate the digital code D1), and switches (e.g., the switches 215-216) coupled to capacitors having lower weights (e.g., the capacitors C5-C6) are controlled by the switching signal SS. In the above examples, a number of capacitors (or switches) controlled by the switching signal SS is 2, but the present disclosure is not limited thereto. According to practical requirements, the number of capacitors (or switches) controlled by the switching signal SS may be at least one, that is, in different embodiments, a number of bits in the switching signal SS may be one or more. The arrangements of the capacitor array circuit 111 are the same as those of the capacitor array circuit 110, and the arrangements of the capacitor array circuit 111 may be understood with reference to FIG. 2, and thus the repetitious descriptions are not further given.

The arrangements of the capacitor array circuit 110 are given for illustrative purposes, and the present disclosure is not limited thereto. In some other embodiments, the first terminals of the capacitors C1-C6 may be configured to output the signal S10, and the second terminals of the capacitors C1-C6 may selectively receive the input signal VIN, the reference voltage VREFP, or the reference voltage VREFN via the switches 201 and 211-216.

Figure 3:
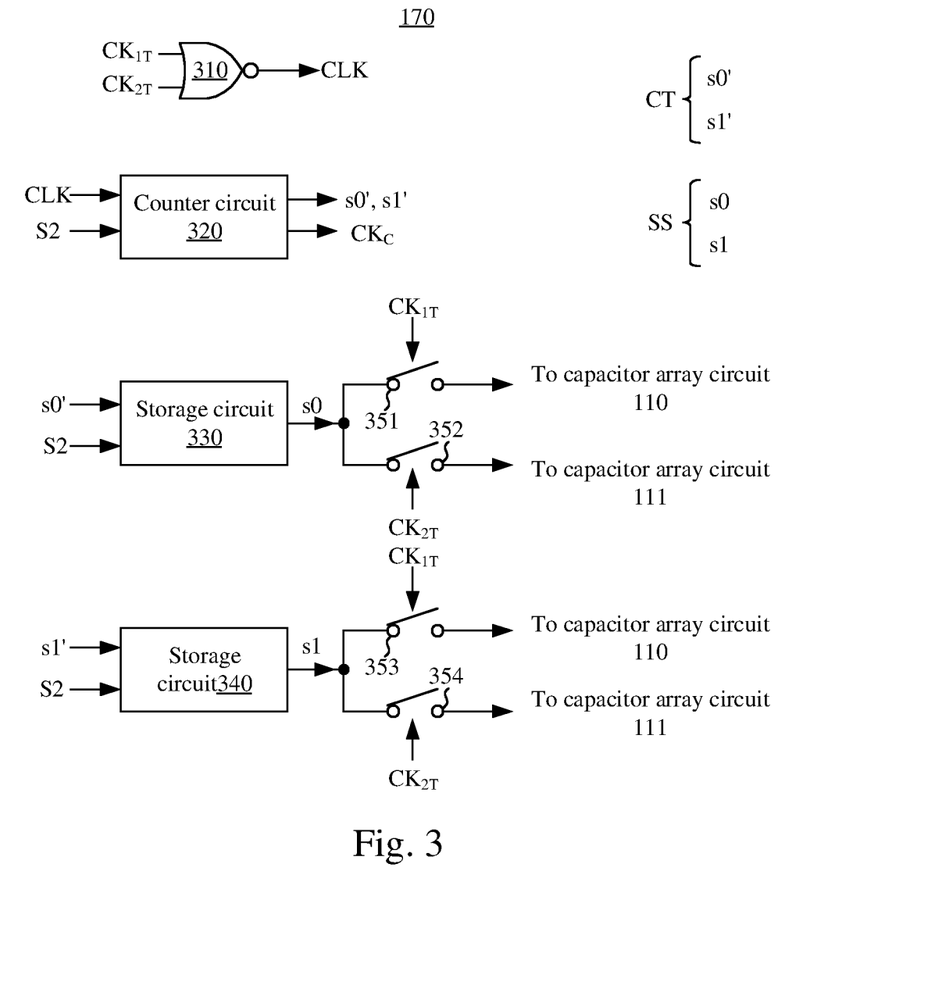
FIG. 3 illustrates a schematic diagram of the control circuitry in FIG. 1A or FIG. 1B according to some embodiments of the present disclosure.

FIG. 3 illustrates a schematic diagram of the control circuitry 170 in FIG. 1A or FIG. 1B according to some embodiments of the present disclosure. In this example, the control circuitry 170 includes a logic gate circuit 310, a counter circuit 320, storage circuits 330 and 340 and switches 351-354. The logic gate circuit 310 generates the clock signal CLK according to the control signal $CK_{1T}$ and the clock signal $CK_{2T}$. In some embodiments, the level of the conversion control signal $CK_C$ is controlled by the clock signal CLK. In some embodiments, the logic gate circuit 310 may be, but not limited to, a NOR gate circuit. The counter circuit 320 counts according to the clock signal CLK and the quantization signal S2, in order to generate the count signal CT and the conversion control signal $CK_C$. Operations regarding herein will be provided with reference to FIG. 5.

Figure 5:
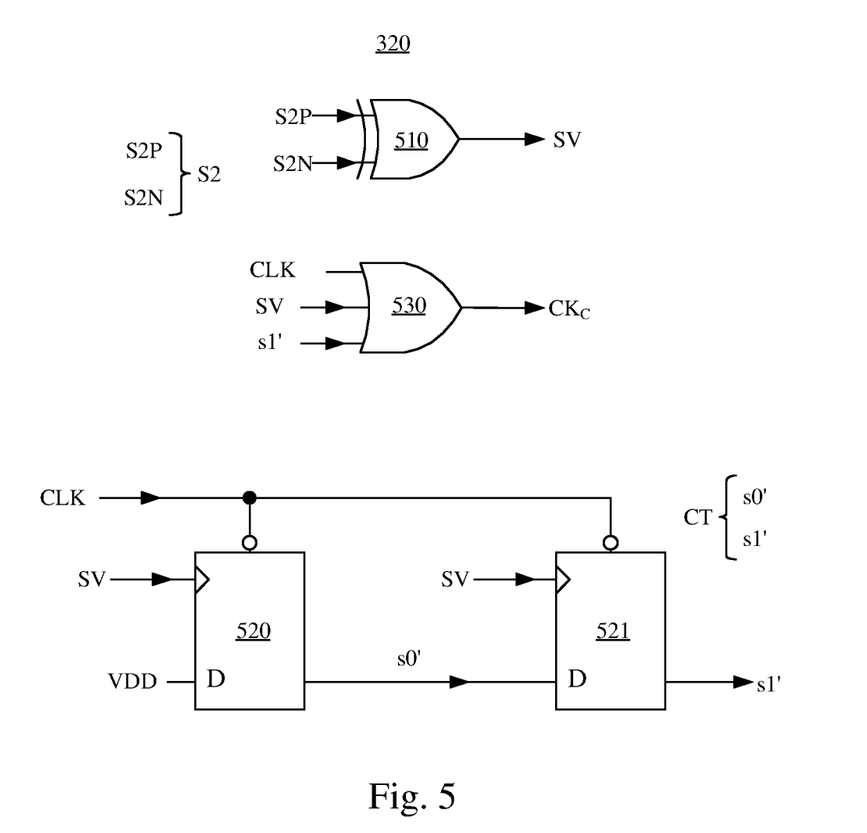
FIG. 5 illustrates a schematic diagram of the counter circuit in FIG. 3 or FIG. 4 according to some embodiments of the present disclosure.
Figure 6:
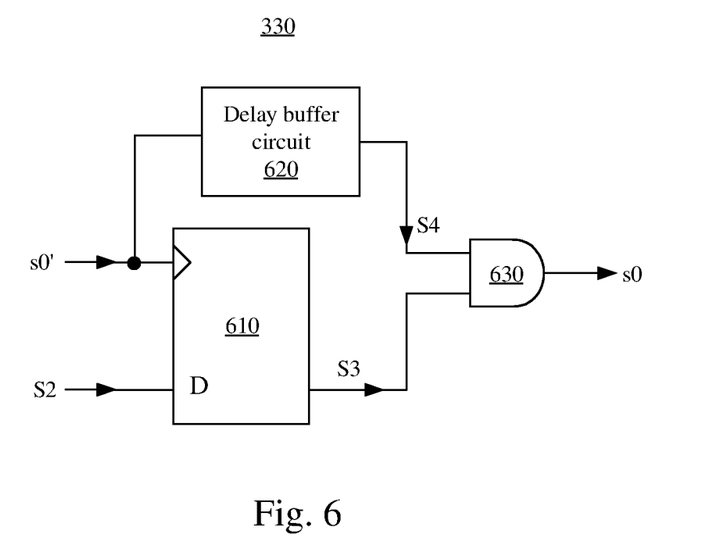
FIG. 6 illustrates a schematic diagram of the storage circuit in FIG. 3 or FIG. 4 according to some embodiments of the present disclosure.

The storage circuit 330 outputs the quantization signal S2 (e.g., the signal S2P in FIG. 5) to be a signal S3 (as shown in FIG. 6) according to the bits s0' of the count signal CT, and generate the bit s0 (i.e., the bit in the switching signal SS) according to a signal S4 (as shown in FIG. 6) and the signal S3, in which the signal S4 is a delayed signal of the count signal CT. The switches 351 and 352 are coupled to the storage circuit 330, and transmit the bit s0 to a corresponding one of the capacitor array circuit 110 and the capacitor array circuit 111 according to the control signal $CK_{1T}$ and the control signal $CK_{2T}$. For example, when the control signal $CK_{1T}$ has the high level (i.e., when the transfer circuit T1 transfer the signal S10 from the capacitor array circuit 110 to be the aforementioned first signal), the switch 351 is turned on and the switch 352 is not turned on, in order to transmit the bit s0 to a switch of the capacitor array circuit 110 (e.g., the switch 215 in FIG. 2). Alternatively, when the control signal $CK_{2T}$ has the high level (i.e., when the transfer circuit T2 transfer the signal S20 from the capacitor array circuit 111 to be the aforementioned first signal), the switch 352 is turned on and the switch 351 is not turned on, in order to transmit the bit s0 to a switch of the capacitor array circuit 111. Detailed arrangements of the storage circuit 330 will be provided with reference to FIG. 6.

Similar to the storage circuit 330, the storage circuit 340 may generate the bit s1 (i.e., another bit in the switching signal SS) according to a bit s1' of the count signal CT and the quantization signal S2 (e.g., the signal S2P in FIG. 5). The switches 353 and 354 are coupled to the storage circuit 340, and transmit the bit s1 to a corresponding one of the capacitor array circuit 110 and the capacitor array circuit 111 according to the control signal $CK_{1T}$ and the control signal $CK_{2T}$. For example, when the control signal $CK_{1T}$ has the high level, the switch 353 is turned on and the switch 354 is not turned on, in order to transmit the bit s1 to a switch of the capacitor array circuit 110 (e.g., the switch 216 in FIG. 2). Alternatively, when the control signal $CK_{2T}$ has the high level, the switch 354 is turned on and the switch 353 is not turned on, in order to transmit the bit s1 to another switch of the capacitor array circuit 111.

Figure 4:
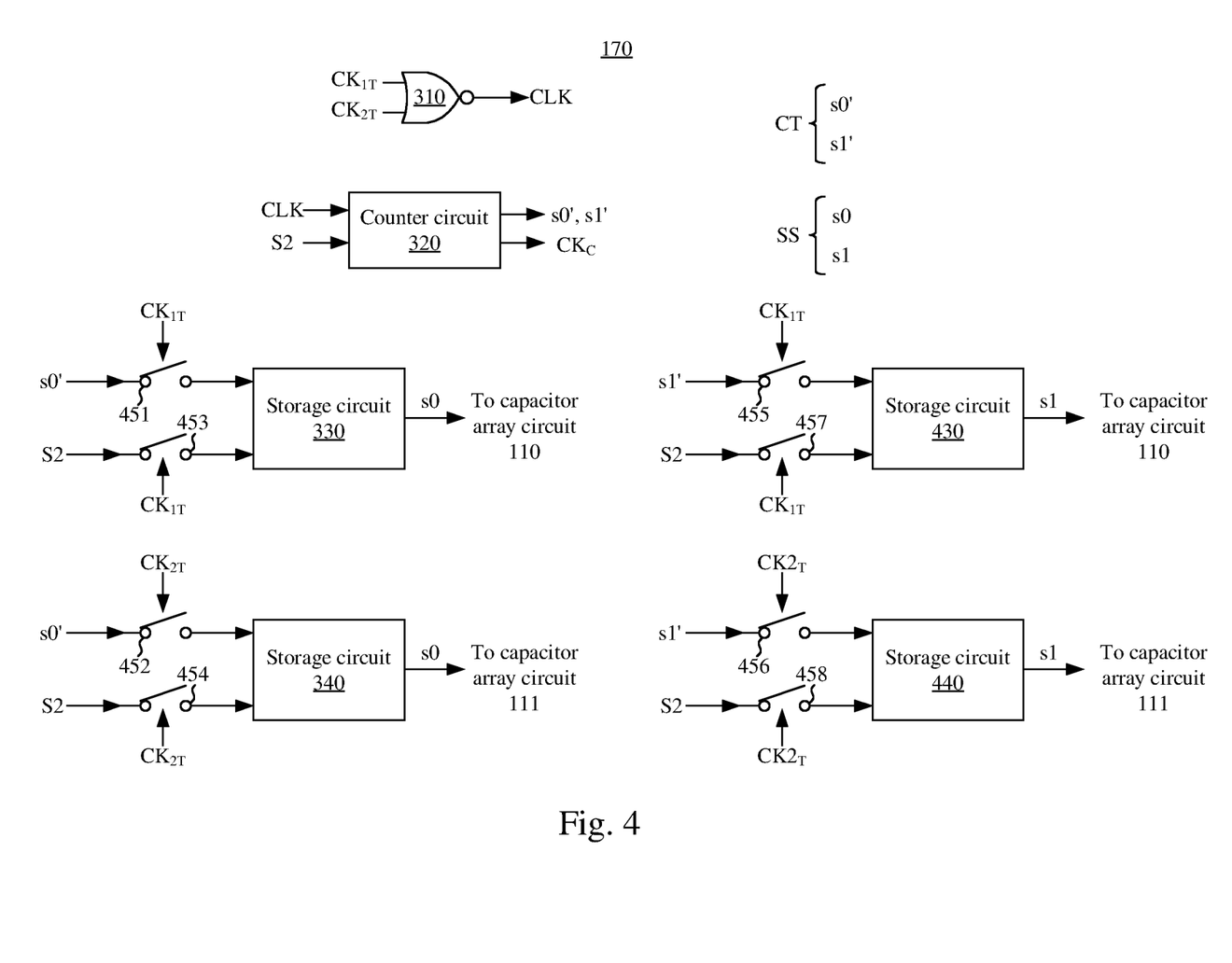
FIG. 4 illustrates a schematic diagram of the control circuitry in FIG. 1A or FIG. 1B according to some embodiments of the present disclosure.

FIG. 4 illustrates a schematic diagram of the control circuitry 170 in FIG. 1A or FIG. 1B according to some embodiments of the present disclosure. In this example, the control circuitry 170 includes the logic gate circuit 310, the counter circuit 320, the storage circuit 330, the storage circuit 340, a storage circuit 430, a storage circuit 440, and switches 451-458. Operations of the logic gate circuit 310, the counter circuit 320, the storage circuit 330, and the storage circuit 340 may be understood with reference to FIG. 3, and thus the repetitious descriptions are not further given.

Different from FIG. 3, in this example, the storage circuits 330 and 340 are respectively corresponding to the capacitor array circuits 110 and 111. The switches 451 and 452 receive the bit s0' of the count signal from the counter circuit 320, and output the bit s0' to one of the storage circuits 330 and 340 according to the control signals $CK_{1T}$ and $CK_{2T}$. For example, when the control signal $CK_{1T}$ has the high level, the switch 451 is turned on and the switch 452 is not turned on, in order to output the bit s0' to the storage circuit 330. Alternatively, when the control signal $CK_{2T}$ has the high level, the switch 452 is turned on and the switch 451 is not turned on, in order to output the bit s0' to the storage circuit 340.

The switches 453 and 454 receive the quantization signal S2 (e.g., the signal S2P) from the quantizer circuit 132, and output the quantization signal S2 (e.g., the signal S2P) to one of the storage circuits 330 and 340 according to the control signals $CK_{1T}$ and $CK_{2T}$. For example, when the control signal $CK_{1T}$ has the high level, the switch 453 is turned on and the switch 454 is not turned on to output the quantization signal S2 (e.g., the signal S2P) to the storage circuit 330. Alternatively, when the control signal $CK_{2T}$ has the high level, the switch 454 is turned on and the switch 453 is not turned on to output the quantization signal S2 (e.g., the signal S2P) to the storage circuit 340. When the storage circuit 330 receives the bit s0' and the quantization signal S2, the storage circuit 330 may generate the bit s0 of the switching signal SS to the switch of the capacitor array circuit 110 (e.g., the switch 215). Alternatively, when the storage circuit 340 receives the bit s0' and the quantization signal S2, the storage circuit 340 may generate the bit s0 of the switching signal SS to the switch of the capacitor array circuit 111.

Similarly, the storage circuits 430 and 440 are respectively arranged corresponding to the capacitor array circuits 110 and 111. The switches 455 and 456 receive the bit s1' of the count signal CT from the counter circuit 320, and output the bit s1' to one of the storage circuits 430 and 440 according to the control signals $CK_{1T}$ and $CK_{2T}$. The switches 457 and 458 receive the quantization signal S2 (e.g., the signal S2P) from the quantizer circuit 132, and output the quantization signal S2 to one of the storage circuits 430 and 440 according to the control signals $CK_{1T}$ and $CK_{2T}$. As a result, the storage circuits 430 and 440 may selectively generate another bit s1 of the switching signal SS, and transmit this bit s1 to a switch of the capacitor array circuit 110 (e.g., the switch 216) or another switch of the capacitor array circuit 111. Operations among the storage circuits 430 and 440 and the switches 455-458 may be understood with those among the storage circuits 330 and 340 and the switches 451-454, and thus the repetitious descriptions are not further given.

It is understood that in the example in FIG. 3 or 4, the number of bits in the count signal CT and the number of storage circuits and switches are related to the number of capacitors (or switches), which is controlled by the switching signal SS, in the capacitor array circuit. For example, in FIG. 2, the number of capacitors (or switches) controlled by switching signal SS in the capacitor array circuit 110 is 2. Accordingly, the number of capacitors (or switches) in the capacitor array circuit 111 controlled by switching signal SS is also 2. Therefore, the control circuitry 170 in FIG. 3 employs two storage circuits. Alternatively, the control circuitry 170 in FIG. 4 employ four storage circuits. As mentioned above, the number of capacitors (or switches) controlled by the switching signal SS can be at least 1 depending on the actual application requirements. It is understood that if the number of capacitors (or switches) controlled by the switching signal SS in each of the capacitor array circuits 110 and 111 is 1, the control circuitry 170 in FIG. 3 may employ one storage circuit. Alternatively, the control circuitry 170 in FIG. 4 may employ two storage circuits. Similarly, the number of switches will be adjusted accordingly. In other words, in different embodiments, the number of storage circuit(s) in the control circuitry 170 may be at least 1.

FIG. 5 illustrates a schematic diagram of the counter circuit 320 in FIG. 3 or FIG. 4 according to some embodiments of the present disclosure. The counter circuit 320 includes a logic gate circuit 510, flip flop circuits 520 and 521, and a logic gate circuit 530. The logic gate circuit 510 is configured to detect the quantization signal S2 to generate a valid signal SV. In some embodiments, the quantizer circuit 132 may be a differential comparator circuit having two output terminals (not shown). In other words, in this example, the quantization signal S2 may include a signal S2P and a signal S2N (which are differential signals outputted from these output terminals). Levels of these two output terminals may be adjusted by a reset circuit (which is included in the quantizer circuit 132) that is controlled by the conversion control signal $CK_C$. For example, the reset circuit may be turned off during a predetermined period of the conversion control signal $CK_C$ and thus does not adjust the levels of these output terminals. Alternatively, the reset circuit is turned on during a reset period of the conversion control signal $CK_C$ to reset the levels of these output terminals to a predetermined level (i.e., the quantization signal S2 is reset to the predetermined level). Accordingly, if the quantizer circuit 132 is not completed (e.g., the quantization signal S2 is not generated), both of the signal S2P and the signal S2N have the predetermined level. Alternatively, if the quantizer circuit 132 completes to generate the quantization signal S2, the signal S2 and the signal S2 have opposite levels (due to being differential signals)). As a result, the logic gate circuit 510 may detect the level of the quantization signal S2 (i.e., the signal S2P and the signal S2N) to generate the valid signal SV.

In some embodiments, the logic gate circuit 510 may be, but not limited to, a XOR gate circuit. As a result, when the signal S2P and the signal S2N have different levels, the valid signal SV has the logic value of 1 to indicate that the quantizer circuit 132 completes the quantization. Alternatively, when the signal S1P and the signal S1N have the same level (e.g., both of them are reset to the predetermined level), the valid signal SV has the logic value of 0 to indicate that the quantization of the coarse analog to digital converter circuitry 120 is not completed. In different embodiments, the logic gate circuit 402A may be implemented with other logic gate circuit(s). For example, the logic gate circuit 402A may be a NAND gate circuit as well.

The flip flop circuits 520 and 521 are coupled in series to form a counter. The flip flop circuits 520 and 521 may be reset according to the clock signal CLK, and sequentially output the voltage VDD to be the bits s0' and s1' of the count signal CT according to the valid signal SV. For example, each of the flip flop circuits 520 and 521 may be a D-type flip flop having an inverting input terminal, in which the inverting input terminal receives the clock signal CLK in order to determine whether to reset the flip flop circuits 520 and 521. When the clock signal CLK has the high level, the flip flop circuits 520 and 521 reset the bits s0' and s1' to the logic value of 0. When the clock signal CLK has the low level, the flip flop circuits 520 and 521 may sequentially output the voltage VDD to be the bits s0' and s1' according to the valid signal SV. For example, when the clock signal CLK has the low level and the valid signal SV has the logic value of 1 for the first time, the flip flop circuit 520 may output the voltage VDD to be the bit s0' (which is the logic value of 1). Afterwards, when the clock signal CLK has the low level and the valid signal SV has the logic value of 1 for the second time, the flip flop circuit 521 may output the bit s0' to be the bit s1' (which is the logic value of 1).

The logic gate circuit 530 generates the conversion control signal $CK_C$ according to the last bit of the count signal CT (e.g., the bit s1'), the clock signal CLK, and the valid signal SV. As mentioned above, the conversion control signal $CK_C$ may control the quantizer circuit 132 to reset the quantization signal S2. In some embodiments, when one of the bit s1', the clock signal CLK, or the valid signal SV has a high level corresponding to the logic value of 1, the conversion control signal $CK_C$ has the reset level, in order to control the quantizer circuit 132 resets the quantization signal S2. Under this condition, the logic gate circuit 530 may be, but not limited to, a OR gate circuit.

As mentioned above, the fine converter circuitry 130 performs the noise shaping signal conversion according to the conversion control signal $CK_C$, and the level of the conversion control signal $CK_C$ is controlled by the clock signal CLK. When at least one of the control signal $CK_{1T}$ and the control signal $CK_{2T}$ has the high level, the clock signal CLK has the low level. Under this condition, if the valid signal SV and the bit s1' are not the logic values of 1, the conversion control signal $CK_C$ may have the low level, such that the quantizer circuit 132 may perform the quantization to generate the quantization signal S2 during the predetermined period of the conversion control signal $CK_C$ (i.e., a period with the low level). In other words, when one of the transfer circuit T1 and the transfer circuit T2 is turn on during an enabling period of a corresponding one of the control signal $CK_{1T}$ and the control signal $CK_{2T}$ (e.g., a period with the high level) to transfer the first signal, the fine converter circuitry 130 may perform the noise shaping signal conversion during the predetermined period of the conversion control signal $CK_C$ (e.g., a period with the low level).

Alternatively, when both of the control signal $CK_{1T}$ and the control signal $CK_{2T}$ have the low levels, the clock signal CLK has the high level. Under this condition, the conversion control signal $CK_C$ has the high level, such that the quantizer circuit 132 may be reset during a reset period of the conversion control signal $CK_C$ (e.g., a period with the high level). In other words, when both of the transfer circuit T1 and the transfer circuit T2 are turned off to not transfer the first signal during a disabling period of the control signal $CK_{1T}$ and that of the control signal $CK_{2T}$ (e.g., a period with the low level), the fine converter circuitry 130 may be reset during a reset period of the conversion control signal $CK_C$ (e.g., a period with the high level).

When the bit s1' is switched from the logic value of 0 to the logic value of 1, it indicates that all quantization operations of the quantizer circuit 132 are completed, and all bits of the count signal CT are generated. Under this condition, the conversion control signal $CK_C$ may have a high level, such that the quantizer circuit 132 is reset (i.e., reset the quantization signal S2) to be ready for the next quantization operation. Similarly, when the valid signal SV has the logic value of 1, it indicates that one quantization of quantizer circuit is completed (for example, the quantization for generating the bit s0' having the logic value of 1). Under this condition, the conversion control signal $CK_C$ responds to the valid signal SV with the logic value of 1 to reset the quantizer circuit 132 to perform the next quantization operation (for example, the quantization of generating the bit s1' having the logic value of 1). Accordingly, it is understood that the counter circuit 320 provides a global control (i.e., to reset the quantizer circuit 132 according to the control signal $CK_{1T}$ and $CK_{2T}$ in the system) and a local control (i.e., to reset the quantizer circuit S2 according to the last bit s1' of the count signal CT and the quantization signal S2 outputted by the quantizer circuit 132) to the fine converter circuitry 130.

As mentioned above, depending on the actual application requirements, the number of capacitors (or switches) controlled by switching signal SS may be at least one. It is understood that if the number of capacitors (or switches) controlled by the switching signal SS in each of the capacitor array circuits 110 and 111 is 1, the number of flip flop circuits in the counter circuit 320 is also 1. In other words, in different embodiments, the number of flip flop circuits in the counter circuit 320 may be at least 1.

FIG. 6 illustrates a schematic diagram of the storage circuit 330 in FIG. 3 or FIG. 4 according to some embodiments of the present disclosure. The storage circuit 330 includes a flip flop circuit 610, a delay buffer circuit 620, and a logic gate circuit 630. The flip flop circuit 610 outputs the quantization signal S2 (e.g., the signal S2P) to be the signal S3 according to the count signal CT. For example, the flip flop circuit 610 may be a D-type flip flop circuit that may output the quantization signal S2 to be the signals according to the bit s0' of the count signal CT. The delay buffer circuit 620 may delay the count signal CT to generate the signal S4. For example, the delay buffer circuit 620 may be a buffer formed with series-coupled inverters, which may delay the bit s0' of the count signal CT to generate a signal S4. The logic gate circuit 630 generate the bit s0 of the switching signal SS according to the signals S3 and S4. For example, the logic gate circuit 630 may be a AND gate circuit that may generate the bit S0 of the switching signal SS according to the signals S3 and S4. Arrangements of the storage circuit 340, 430, and/or 440 may be understood with reference to those of the storage circuit 330, and thus the repetitious descriptions are not further given.

As described above, the time-interleaved analog to digital converter may perform the noise shaping signal conversion based on the control of the counter, in order to further improve the signal-to-noise ratio. Circuits associated with the counter control and those associated with the noise shaping signal conversion are arranged adjacent to each other, in order to reduce the length of a wire between both parties to lower the loading. As a result, such time-interleaved analog to digital converter can be applied to high-speed applications.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A time-interleaved analog to digital converter, comprising:
    a plurality of capacitor array circuits configured to sequentially sample an input signal and generate a plurality of first residue signals according to a plurality of first quantization signals, wherein the plurality of first quantization signals are generated based on a coarse analog to digital conversion performed based on the input signal;
    a plurality of first transfer circuits configured to sequentially transfer the plurality of first residue signals from the plurality of capacitor array circuits according to a plurality of first control signals;
    a fine converter circuitry configured to perform a noise shaping signal conversion on a first signal in the plurality of first residue signals and a second signal in a plurality of second residue signals according to a conversion control signal, in order to generate a second quantization signal;
    a control circuitry configured to count according to the second quantization signal to generate a count signal and the conversion control signal, and output the count signal to be a switching signal according to the plurality of first control signals;
    a plurality of second transfer circuits configured to sequentially transfer the plurality of second residue signals from the plurality of capacitor array circuits to the fine converter circuitry according to a plurality of second control signals, wherein the plurality of capacitor array circuit are further configured to generate the plurality of second residue signals in response to the noise shaping signal conversion and adjust the plurality of second residue signals according to the switching signal; and
    an encoder circuit configured to generate a digital output according to the second quantization signal and a corresponding one of the plurality of first quantization signals.

2. The time-interleaved analog to digital converter of claim 1, wherein the control circuitry is configured to generate a clock signal according to the plurality of first control signals, and generate the conversion control signal according to a last bit of the count signal, the clock signal, and the second quantization signal.

3. The time-interleaved analog to digital converter of claim 2, wherein the control circuitry comprises:
    a logic gate circuit configured to generate the clock signal according to the plurality of first control signals.

4. The time-interleaved analog to digital converter of claim 3, wherein the logic gate circuit is a NOR gate circuit.

5. The time-interleaved analog to digital converter of claim 1, wherein when one of the plurality of first transfer circuits transfers the first signal according to a corresponding one of the plurality of first control signals, the fine converter circuitry performs the noise shaping signal conversion according to the conversion control signal.

6. The time-interleaved analog to digital converter of claim 1, wherein when the plurality of first transfer circuits do not transfer the first signal, the fine converter circuitry is reset according to the conversion control signal.

7. The time-interleaved analog to digital converter of claim 1, wherein the control circuitry comprises:
    a counter circuit configured to count according to a clock signal and the second quantization signal to generate the count signal and the conversion control signal,
    wherein the fine converter circuitry is further configured to selectively perform the noise shaping signal conversion or reset the second quantization signal according to the conversion control signal.

8. The time-interleaved analog to digital converter of claim 7, wherein the counter circuit comprises:
    a first logic gate circuit configured to detect the second quantization signal to generate a valid signal;
    a flip flop circuit configured to be reset according to the clock signal, and output a voltage to be the count signal according to the valid signal; and
    a second logic gate circuit configured to generate the conversion control signal according to a last bit of the count signal, the clock signal, and the valid signal.

9. The time-interleaved analog to digital converter of claim 8, wherein the first logic gate circuit is a XOR gate circuit.

10. The time-interleaved analog to digital converter of claim 8, wherein the second logic gate circuit is an OR gate circuit.

11. The time-interleaved analog to digital converter of claim 7, wherein the control circuitry further comprises:
    a storage circuit configured to output the second quantization signal to be a third signal according to the count signal, and generate the switching signal according to a fourth signal and the third signal, and the fourth signal is a delayed signal of the third signal; and
    a plurality of switches configured to output the switching signal to a corresponding one of the plurality of capacitor array circuits according to the plurality of first control signals.

12. The time-interleaved analog to digital converter of claim 11, wherein the storage circuit comprises:
    a flip flop circuit configured to output the second quantization signal to be the third signal according to the count signal;
    a delay buffer circuit configured to delay the count signal to generate the fourth signal; and
    a logic gate circuit configured to generate the switching signal according to the fourth signal and the third signal.

13. The time-interleaved analog to digital converter of claim 12, wherein the logic gate circuit is a AND gate circuit.

14. The time-interleaved analog to digital converter of claim 11, wherein the plurality of switches comprise:
- a first switch configured to be turned on according to one of the plurality of first control signals, in order to output the switching signal to a first capacitor array circuit of the plurality of capacitor array circuits; and
- a second switch configured to be turned on according to another one of the plurality of first control signals, in order to output the switching signal to a second capacitor array circuit of the plurality of capacitor array circuits.

15. The time-interleaved analog to digital converter of claim 7, wherein the control circuitry further comprises:
- a plurality of storage circuits respectively corresponding to the plurality of capacitor array circuits, wherein each of the plurality of storage circuits is configured to output the second quantization signal to be a third signal according to the count signal, and generate the switching signal according to a fourth signal and the third signal, and the fourth signal is a delayed signal of the count signal;
- a plurality of first switches configured to output the count signal to one of the plurality of storage circuits according to the plurality of first control signals; and
- a plurality of second switches configured to output the second quantization signal to the one of the plurality of storage circuits according to the plurality of first control signals.

16. The time-interleaved analog to digital converter of claim 7, wherein the clock signal is generated based on the plurality of first control signals.

17. The time-interleaved analog to digital converter of claim 1, wherein each of the plurality of capacitor array circuits comprises:
- a plurality of capacitors;
- a plurality of first switches respectively coupled to a plurality of first capacitors in the plurality of capacitors and configured to be controlled by a corresponding one of the plurality of first quantization signals; and
- a second switch coupled to a second capacitor in the plurality of capacitors and configured to be controlled by the switching signal.

18. The time-interleaved analog to digital converter of claim 17, wherein a weight corresponding to the second capacitor is lower than weights corresponding to the plurality of first capacitors.

19. The time-interleaved analog to digital converter of claim 1, further comprising:
- a coarse analog to digital converter circuitry configured to perform the coarse analog to digital conversion to generate the plurality of first quantization signals,
- wherein the coarse analog to digital conversion comprises a successive approximation register analog to digital conversion or a flash analog to digital conversion.

20. The time-interleaved analog to digital converter of claim 1, wherein the fine converter circuitry comprises:
- a noise shaping circuit configured to perform a noise shaping according to the second signal to generate a third signal; and
- a quantizer circuit configured to generate the second quantization signal according to the third signal and the first signal.

* * * * *